United States Patent
Jeong et al.

(10) Patent No.: US 11,887,892 B2
(45) Date of Patent: Jan. 30, 2024

(54) METHOD FOR FORMING SEMICONDUCTOR DIE WITH DIE REGION AND SEAL-RING REGION

(71) Applicant: MagnaChip Semiconductor, Ltd., Cheongju-si (KR)

(72) Inventors: Jin Won Jeong, Seoul (KR); Jang Hee Lee, Cheongju-si (KR); Young Hun Jun, Cheongju-si (KR); Jong Woon Lee, Cheongju-si (KR); Jae Sik Choi, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 99 days.

(21) Appl. No.: 17/231,214

(22) Filed: Apr. 15, 2021

(65) Prior Publication Data

US 2022/0005733 A1   Jan. 6, 2022

(30) Foreign Application Priority Data

Jul. 6, 2020   (KR) .................. 10-2020-0082705

(51) Int. Cl.
| | |
|---|---|
| *H01L 21/78* | (2006.01) |
| *H01L 21/66* | (2006.01) |
| *H01L 21/56* | (2006.01) |
| *H01L 23/10* | (2006.01) |
| *H01L 23/31* | (2006.01) |

(52) U.S. Cl.
CPC .............. *H01L 21/78* (2013.01); *H01L 21/56* (2013.01); *H01L 22/14* (2013.01); *H01L 22/32* (2013.01); *H01L 23/10* (2013.01); *H01L 23/3171* (2013.01)

(58) Field of Classification Search
CPC .......... H01L 21/78; H01L 21/56; H01L 22/14; H01L 22/32; H01L 23/10; H01L 23/3171; H01L 2224/02166; H01L 23/585; H01L 24/10; H01L 21/31116; H01L 24/05; H01L 24/13
USPC ........................................................ 438/460
See application file for complete search history.

(56) References Cited

U.S. PATENT DOCUMENTS

| | | | |
|---|---|---|---|
| 6,352,940 B1* | 3/2002 | Seshan .............. | H01L 21/76826 438/762 |
| 7,514,291 B2 | 4/2009 | Akram | |
| 2006/0213866 A1* | 9/2006 | Hirotsu .............. | H01J 37/32935 156/345.1 |
| 2007/0290204 A1* | 12/2007 | Jao .......................... | H01L 22/34 257/48 |
| 2015/0228547 A1* | 8/2015 | Shih ........................ | H01L 22/30 257/48 |

(Continued)

*Primary Examiner* — Duy T Nguyen
(74) *Attorney, Agent, or Firm* — NSIP Law

(57) ABSTRACT

A method for forming a semiconductor die, includes forming an interlayer dielectric layer on a substrate having a semiconductor die region, a seal-ring region, and a scribe line region, forming a metal pad and a test pad on the interlayer dielectric layer, forming a passivation dielectric layer on the interlayer dielectric layer, the metal pad, and the test pad, first etching the passivation dielectric layer and the interlayer dielectric layer existing between the seal-ring region and the scribe line region to a predetermined depth using a plasma etching process, second etching the passivation dielectric layer to expose the metal pad and the test pad, forming a bump on the metal pad, and dicing the substrate while removing the scribe line region by mechanical sawing.

19 Claims, 13 Drawing Sheets

(56) References Cited

U.S. PATENT DOCUMENTS

2019/0035750 A1* 1/2019 Han ........................ H01L 22/32
2019/0207019 A1* 7/2019 Tsai .................. H01L 29/42316
2020/0312715 A1* 10/2020 Choi ....................... H01L 24/11

* cited by examiner

METHOD FOR FORMING SEMICONDUCTOR DIE WITH DIE REGION AND SEAL-RING REGION

CROSS-REFERENCE TO RELATED APPLICATIONS

This application claims the benefit under 35 U.S.C. 119(a) of Korean Patent Application No. 10-2020-0082705 filed on Jul. 6, 2020, with the Korean Intellectual Property Office, the entire disclosure of which is incorporated herein by reference for all purposes.

BACKGROUND

1. Field

The present disclosure relates to a method for forming a semiconductor die and a semiconductor device.

2. Description of Related Art

Due to the high resolution of display devices, a fine pattern may be desired for a display IC, and in order to implement such a fine pattern, it may be desirable to prevent a short between patterns. That is, as the pitch between wirings decreases due to the miniaturization of display ICs, insulation may become an issue.

FIG. 7 is a typical process of dicing a device through a blade dicing process. Typically, as a chip size is reduced and a dielectric layer is used in a semiconductor device, various problems have arisen from the diamond blade sawing process. In the blade dicing 350 process, a crack 140 is generated that affects the semiconductor device region, which may result in a defect in the device. In addition, when the metal and dielectric layer regions in the test pattern of the scribe line 115 are sawn during the blade dicing 350 process, burrs or byproducts 130 generated during sawing may be upwardly-generated to the device region, which may result in a short circuit in the insulation when the device is operated afterwards. Silicon debris or burr refers to debris, Si debris (silicon debris), burr and the like generated on the passivation dielectric layer 80, and this may be a derivative which a metal component such as copper or aluminum and a silicon element are combined. Such burrs or silicon debris may lead to defective packaging in a subsequent process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for forming a semiconductor die, includes forming an interlayer dielectric layer on a substrate having a semiconductor die region, a seal-ring region, and a scribe line region, forming a metal pad and a test pad on the interlayer dielectric layer, forming a passivation dielectric layer on the interlayer dielectric layer, the metal pad, and the test pad, first etching the passivation dielectric layer and the interlayer dielectric layer existing between the seal-ring region and the scribe line region to a predetermined depth using a plasma etching process, second etching the passivation dielectric layer to expose the metal pad and the test pad, forming a bump on the metal pad, and dicing the substrate while removing the scribe line region by mechanical sawing.

The first etching may expose a surface of the substrate.

The first etching may partially etch the interlayer dielectric layer to not expose a surface of the substrate.

The first etching may define a conic contour in the interlayer dielectric layer.

In another general aspect, a method for forming a semiconductor die of a semiconductor device in which a substrate, an interlayer dielectric layer, a metal pad, and a test pad are formed, and a passivation dielectric layer is formed on the interlayer dielectric layer, the metal pad, and the test pad, includes etching the interlayer dielectric layers on both sides of the test pad using a plasma etching process to expose the substrate, etching the passivation dielectric layer to partially expose the metal pad and the test pad, forming a bump on the metal pad, and dicing the substrate using a blade dicing process.

The plasma etching process may use a combination of $CF_4/O_2/N_2$ gases.

The method may further include testing, after the etching the passivation dielectric layer, a performance of the semiconductor device using the test pad.

The method may further include testing, after forming a bump on the metal pad, a connection state of the bump and the metal pad using the bump.

The passivation dielectric layer may include a silicon nitride layer and an oxide layer.

The first etching may etch a portion of the substrate by over-etching a surface of the substrate.

A remaining interlayer dielectric layer may have a thickness of 0.2 to 3 μm.

The interlayer dielectric layer may be formed of a low-k dielectric layer.

In another general aspect, a semiconductor device includes a substrate, an interlayer dielectric layer on the substrate, a metal pad and a test pad on the interlayer dielectric layer, and a passivation dielectric layer formed on the interlayer dielectric layer, the metal pad, and the test pad, and patterned to expose a portion of the metal pad and the test pad. Portions of the interlayer dielectric layer on both sides of the test pad are etched to expose the substrate.

The interlayer dielectric layer may include a first interlayer dielectric layer on the substrate, and a second interlayer dielectric layer on the first interlayer dielectric layer. A metal wire may be formed on the first interlayer dielectric layer.

The first interlayer dielectric layer may be a low-k dielectric layer.

The first interlayer dielectric layer and the second interlayer dielectric layer may be the same dielectric layer.

The second interlayer dielectric layer may have a higher dielectric constant value than the first interlayer dielectric layer.

The device may further include a bump connected to the metal pad.

After the portions of the interlayer dielectric layer are etched, another portion of the interlayer dielectric layer may exist on the substrate at a predetermined thickness.

In another general aspect, a method of forming a semiconductor device include forming an interlayer dielectric layer on a substrate, forming a metal pad and a test pad on the interlayer dielectric layer, forming a passivation dielectric layer on the interlayer dielectric layer, the metal pad, and the test pad, and etching the passivation dielectric layer to expose a portion of the metal pad and the test pad, and portions of the interlayer dielectric layer on both sides of the test pad to expose the substrate.

The passivation dielectric layer and the interlayer dielectric layer are etched using a plasma etching process.

The method may further include dicing the substrate to remove a scribe line region of the substrate by mechanical sawing.

The interlayer dielectric layer may include a first interlayer dielectric layer formed on the substrate, a second interlayer dielectric layer formed on the first interlayer dielectric layer, and a metal wire formed on the first interlayer dielectric layer.

The first interlayer dielectric layer may be a low-k dielectric layer.

The first interlayer dielectric layer and the second interlayer dielectric layer may be the same dielectric layer.

The second interlayer dielectric layer may have a higher dielectric constant value than the first interlayer dielectric layer.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
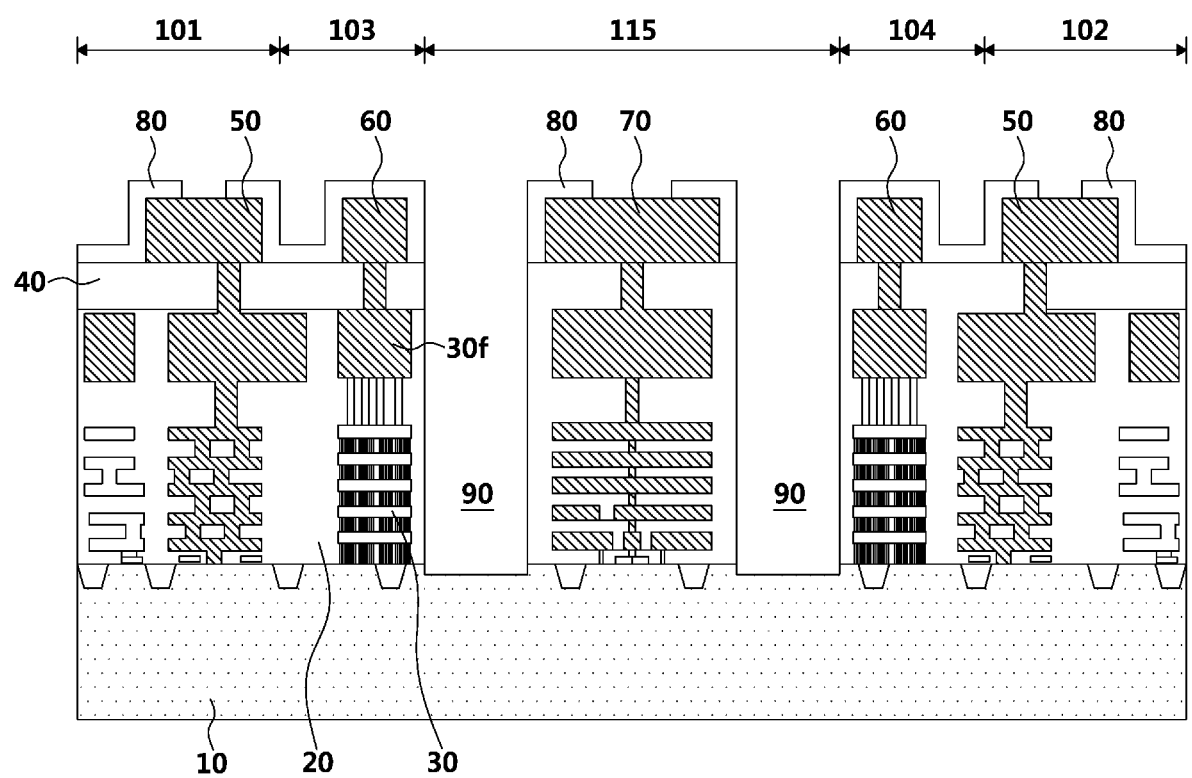
FIG. 1 is a cross-sectional view of an example of a semiconductor device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present disclosure relates to a semiconductor die providing a semiconductor wafer in which an interlayer dielectric layer in a scribe line region is etched, thereby forming a semiconductor die while preventing generating of burr or silicon debris.

The present disclosure is to form a semiconductor die while completely eliminating generating of silicon debris or burrs by a typical blade dicing process.

Another aspect of the present disclosure is to prevent a problem in which a mechanical stress is increased in an active region of an interlayer dielectric layer when a blade dicing process is performed for forming a semiconductor die, thereby minimizing a defect rate of a semiconductor die.

Hereinafter the present disclosure is described in further detail with respect to the example illustrated in the drawings.

Figure 2:
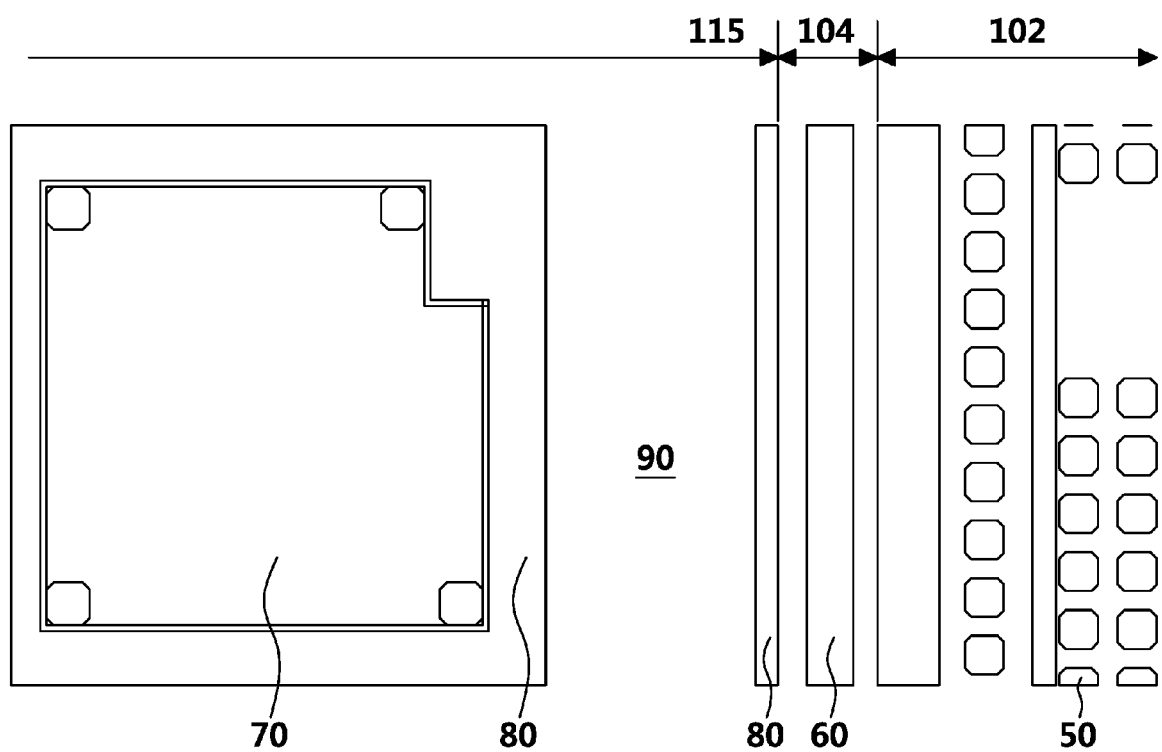
FIG. 2 is a plan view of FIG. 1.

FIG. 1 is a cross-sectional view of an example of a semiconductor device, and FIG. 2 is a plan view of FIG. 1. As illustrated, the semiconductor device includes semiconductor die regions 101 and 102, a scribe line 115 region, and seal-ring regions 103 and 104.

The semiconductor die regions 101 and 102 may be regions in which semiconductor devices for signal processing are formed. Thus, a gate dielectric layer, a gate electrode, a contact plug, a metal wiring 30, a via, a metal pad 50, 60, 70 and the like may be formed for signal processing. For convenience, the semiconductor die region is divided into a die region 1 (101) and a die region 2 (102). The die region 1 (101) and the die region 2 (102) may be regions in which the same semiconductor device is formed.

The scribe line region 115 may be a region in which a test pattern for testing a performance of a semiconductor device formed in a semiconductor die region is formed. Alternatively, it may be a region in which a pattern capable of measuring the thickness of a residual layer, a pattern length, or the like is formed after an etching process, or a pattern for mask alignment is formed. The scribe line region is a region that may be later removed by a sawing process.

Seal-ring regions 103 and 104 may be desired for preventing cracks when dicing a semiconductor device.

In the semiconductor device, a substrate 10 and a first interlayer dielectric layer 20 on the substrate 10 are formed. The first interlayer dielectric layer 20 may be formed using a low-k dielectric layer. Here, the low-k dielectric layer refers to a material having a dielectric constant value smaller than a dielectric constant value (3.9-4.2) of the silicon oxide layer. SiOF, organosilicate glass (OSG) or carbon-doped oxide (CDO, SiOC(H)), porous silicon dioxide, porous organosilicate glass, spin-on organic polymeric dielectric may be used as a low-k dielectric layer. Such a low-k dielectric layer may be desired for reducing RC delay. In addition, a plurality of multi-layer metal (MLM) 30 may be formed on the first interlayer dielectric layer 20. Copper (Cu) metal or aluminum (Al) metal may be used for the metal wiring 30. Copper metal is widely used because it has a lower specific resistance than aluminum metal. The last metal wiring 30f of the metal wiring may be formed to be thicker than the thickness of the other metal wiring 30 in order to have a low resistance.

In addition, in the semiconductor device, a second interlayer dielectric layer 40 is formed on the last metal wiring 30f and the first interlayer dielectric layer 20. The first interlayer dielectric layer and the second interlayer dielectric layer 40 may be collectively referred to as an interlayer dielectric layer.

In other words, the interlayer dielectric layer of the semiconductor device according to the example of the present disclosure may include the first and second interlayer dielectric layers 20 and 40. The second interlayer dielectric layer 40 may be desired for preventing moisture, and for mitigating impact when wire bonding to a metal pad. It has a higher dielectric constant than that of the first interlayer dielectric layer 20. Alternatively, the second interlayer dielectric layer 40 may use the dielectric layer same as the first interlayer dielectric layer 20 in order to reduce the RC delay. A thick silicon oxide layer, silicon nitride layer, or silicon oxynitride layer may be used for the second interlayer dielectric layer 40.

Metal pads 50 and 60 and test pad 70 are formed in the semiconductor die region, the scribe line region, and the seal-ring region, respectively. Aluminum (Al) metal may be used for the metal pads 50 and 60 and the test pad 70.

A passivation dielectric layer 80 is formed on the first and second interlayer dielectric layers 20 and 40, the metal pads 50 and 60, and the test pad 70. The passivation dielectric layer 80 may be desired for protecting the device from external moisture. The passivation dielectric layer 80 may be formed by successively depositing a silicon oxide layer and a silicon nitride layer. That is, the passivation dielectric layer 80 may be a double layer of a silicon oxide layer and a silicon nitride layer. Alternatively, a silicon nitride layer may be used alone. The passivation dielectric layer 80 may be formed in direct contact with the second interlayer dielectric layer 40. The passivation dielectric layer 80 may be formed while surrounding the metal pads 50 and 60 and the test pad 70.

In the semiconductor device according to the present disclosure, the passivation dielectric layer 80 may be patterned to expose the metal pads 50 and 60 and the test pad 70.

As illustrated in FIG. 1, the semiconductor device according to the present disclosure proposes a structure of which a passivation dielectric layer 80 is patterned to expose a metal pad 50 of the die region 1 (101), the die region 2 (102), and a part of the test pad 70 of the scribe line 115 region. Further, interlayer dielectric layers positioned on both sides of the test pad 70 are etched until the substrate is exposed. That is, as illustrated with a reference numeral 90, the passivation dielectric layers on both sides of the test pad 70 are removed from the scribe line region, and the interlayer dielectric layers 20 and 40 are etched. When the passivation dielectric layer 80 in the scribe line region is removed, both the second interlayer dielectric layer 40 and the first interlayer dielectric layer 20 are etched.

The periphery of the test pad 70 is etched because a test process for determining whether a semiconductor device is defective is to be performed in a manufacturing process, and the test pad 70 may be desired for such a test process. If the test pad 70 is also etched, such a test process cannot be performed, thus, it may be impossible to test whether the manufactured semiconductor device is defective or not.

In addition, when both the test pad and the periphery are etched, the etching range increases, resulting in improper etching to the lower region of the test pad. In addition, due to the various patterns of the metal wiring 30 in the test region, it may not be all etched with one etching gas. Manufacturing costs may increase because various etching gases and conditions need to be newly set.

According to such a structure, a laser grooving process which is performed to form a semiconductor die of a semiconductor device may be omitted in the present disclosure. Therefore, it may be possible to prevent problems such as short-circuit defects and the like that occur due to the silicon debris generated during the laser grooving process.

FIG. 2 is a plan view according to an example of the present disclosure.

As illustrated in FIG. 2, a test pad 70 is formed on the scribe line, and a passivation dielectric layer 80 is patterned around it. And there is a region 90 which the interlayer dielectric layers 20 and 40 are removed from the periphery of the passivation dielectric layer 80 by a plasma etching process, for example. The interlayer dielectric layers 20 and 40 may be removed using wet etching, instead of using the plasma etching process.

Figure 3:
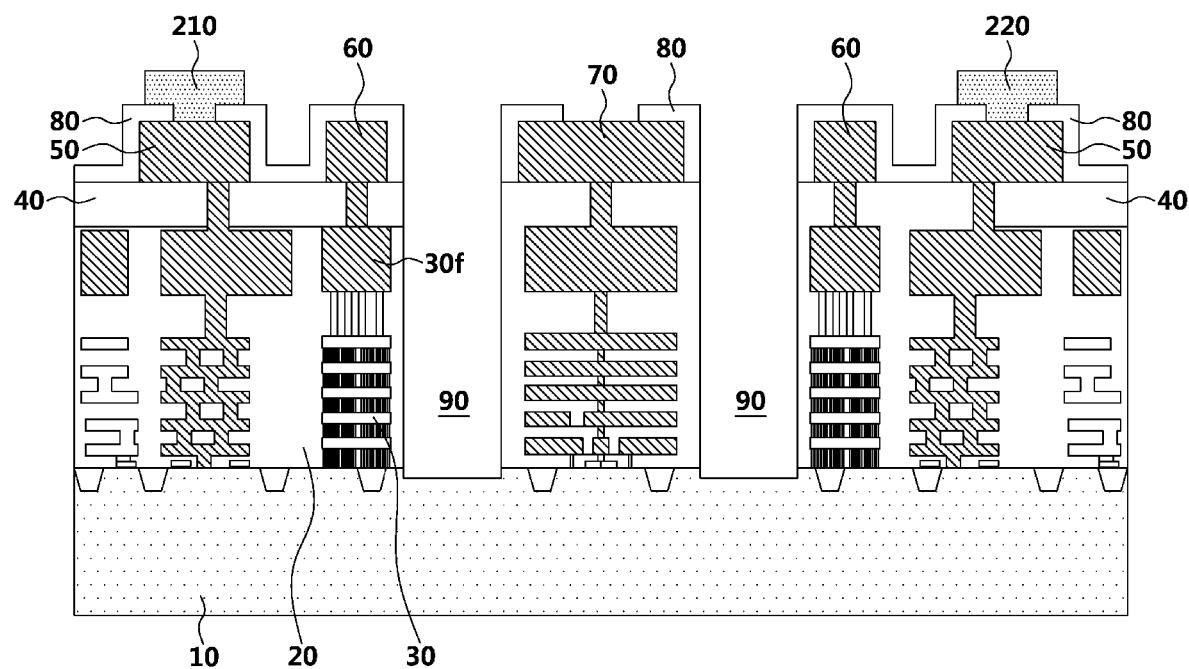
FIG. 3 is a cross-sectional view of an example of a semiconductor device after a bump is formed.

FIG. 3 is a cross-sectional view of an example of a semiconductor device after forming a bump. As illustrated in FIG. 3, in the semiconductor device, according to the example of the present disclosure, metal bumps 210 and 220 are formed on the semiconductor device using gold material or the like. The metal bumps 210 and 220 of the semiconductor device, according to the example of the present disclosure, are connected one-to-one with copper (Cu) lead lines formed on polyimide in a packaging process later. The metal bumps 210 and 220 may be formed by being directly connected to the metal pad 50. Connection is possible because the passivation dielectric layer 80 is removed on the metal pad 50.

Figure 4A:
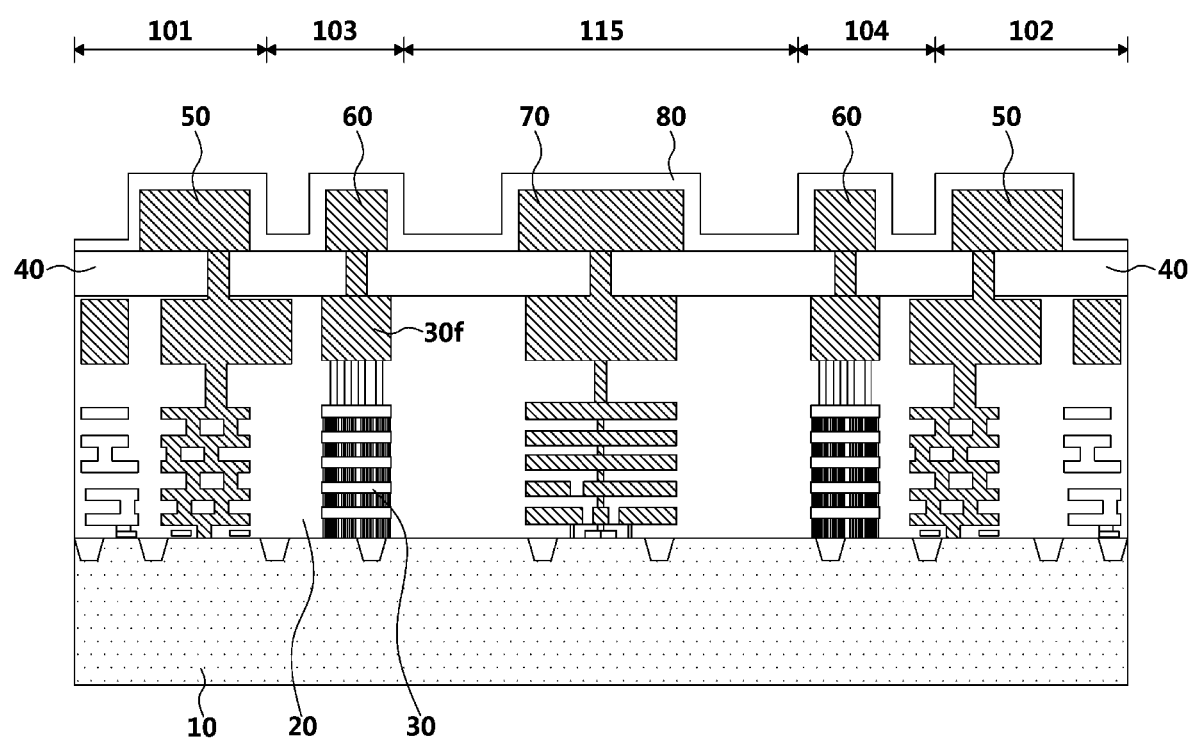
FIGS. 4A to 4E are cross-sectional views illustrating examples of a manufacturing process of a semiconductor device.

FIGS. 4A to 4E are cross-sectional views illustrating examples of a manufacturing process of a semiconductor device. As illustrated in FIG. 4A, the semiconductor device is divided into semiconductor die regions 101 and 102, a scribe line 115 region, and seal-ring regions 103 and 104.

The semiconductor device includes a substrate 10, an interlayer dielectric layer, including a first interlayer dielectric layer 20 and a second interlayer dielectric layer 40 on the substrate 10, metal pads 50 and 60 and a test pad 70 formed on the interlayer dielectric layer, and a passivation dielectric layer 80 deposited on the interlayer dielectric layer, the metal pads 50 and 60, and the test pad 70. The metal pads 50 and 60 are formed in the semiconductor die region and the seal-ring region, and the test pad 70 is formed in the scribe line region.

Figure 4B:
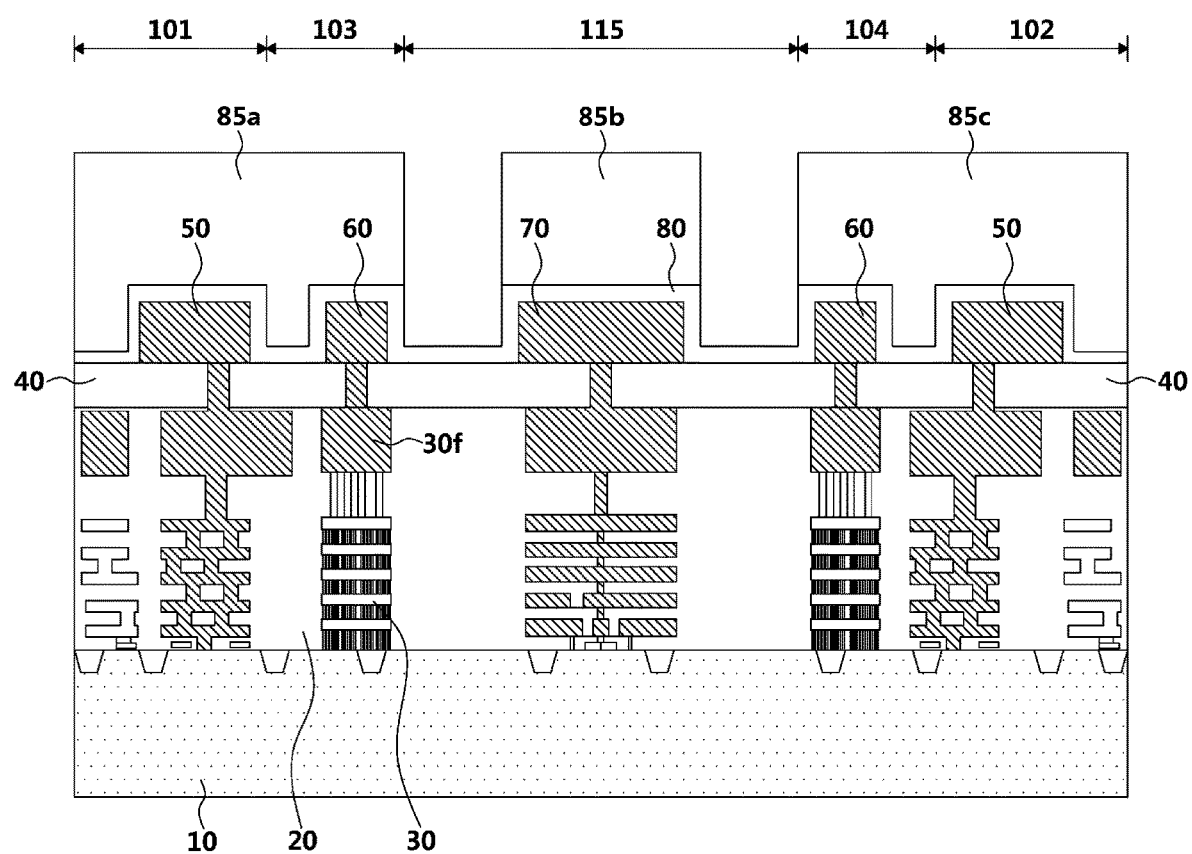

FIG. 4B is a cross-sectional view of the passivation dielectric layer on both sides of the test pad 70 before an etching process. As illustrated, mask patterns 85a to c are formed on a die region 1 (101), a die region 2 (102), seal-ring regions 103 and 104 and a scribe line 115. The mask patterns 85a to c are formed on a portion of the scribe line 115 except for the periphery regions on both sides of the test pad 70. The first mask patterns 85a to c may be composed of a photo-resist material, and the mask patterns 85a to c are formed to have a predetermined thickness because a part of the mask patterns 85a to c may be etched during an interlayer dielectric layer etching process afterwards.

As for an etching process, there are a wet etching and a dry etching methods, and a dry etching is performed in this example. And in another example, a wet etching process may be performed. A material used for wet etching may be a mixture of hydrofluoric acid (HF) and nitric acid ($HNO_3$), or hydrogen peroxide (H2O2) or carbonic acid (CH3COOH).

When performing dry etching, a plasma etching may be performed. Etching gases used for plasma etching include $CF_4$, Ar, $O_2$, C4F8, and CHF3 and the like, and may be used by combining them.

Figure 4C:
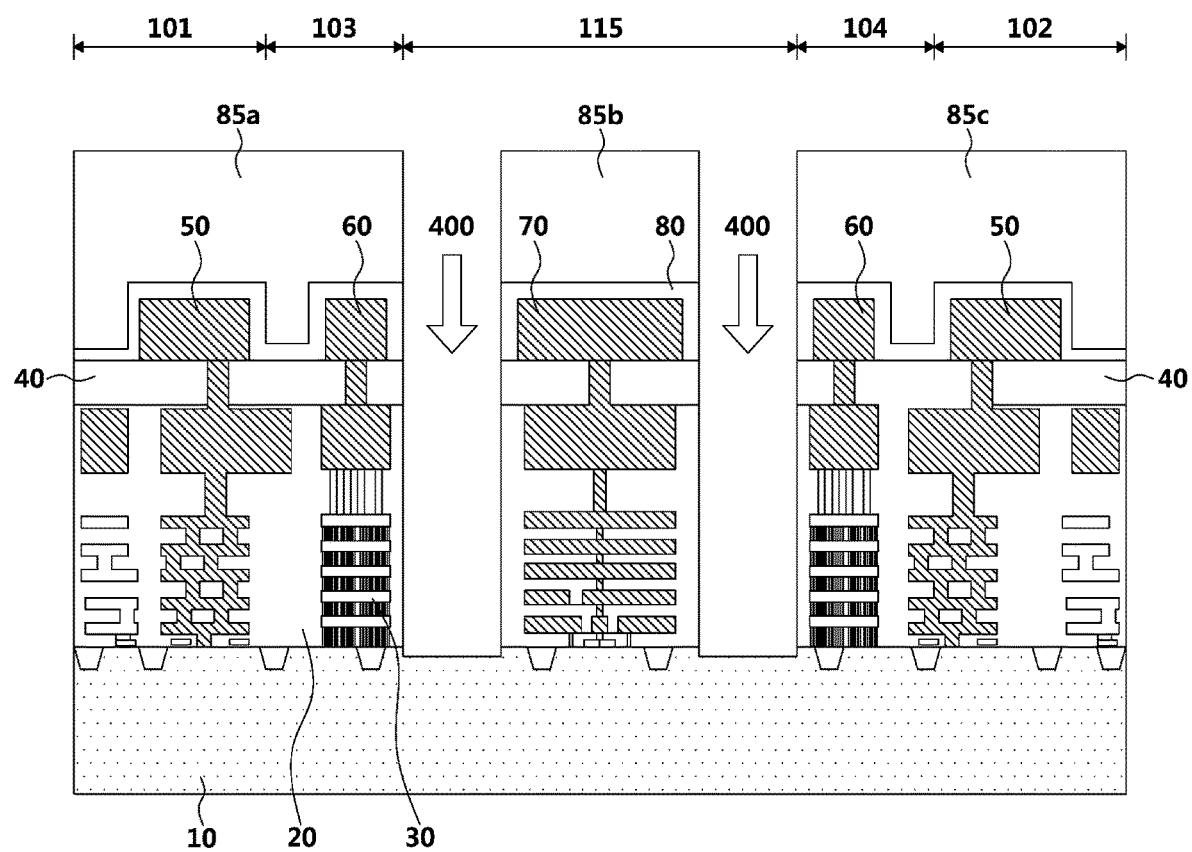

FIG. 4C is a cross-sectional view illustrating an etching process for interlayer dielectric layer regions on both sides of the test pad 70. With respect to the regions around both sides of the test pad 70 in the scribe line region, the passivation dielectric layer 80 and the interlayer dielectric layers 20 and 40, under the passivation dielectric layer 80, are etched by a plasma etching process. The etching may be performed using an etching gas 400 capable of etching the passivation dielectric layer 80 and the interlayer dielectric layers 20 and 40 to a predetermined depth.

Here, the passivation dielectric layer 80 and the interlayer dielectric layers 20 and 40 may be etched using different etching gases. This may be because the passivation dielectric layer 80 and the interlayer dielectric layers 20 and 40 are composed of different materials. When the passivation dielectric layer 80 is composed of a silicon nitride layer, a plasma etching process in which a $CF_4/O_2$ gas is combined may be used.

When the first and second interlayer dielectric layers 20 and 40 are composed of a silicon oxide layer or SiOC, SiOCN, or the like, the dielectric layer may be etched using a gas mixture containing CxFy or a gas mixture containing CxHyFz. For example, a plasma etching process combining $CF_4/O_2/N_2/Ar$ gas may be used. At the time of etching, a portion of the interlayer dielectric layer 20 may be over-etched to etch the substrate. At this time, a portion of the upper surface of the substrate may be etched. If over-etching is not performed, a portion of the interlayer dielectric layer may remain, and this may cause damage during a blade dicing process as the crack is transferred to the semiconductor device region due to stress.

However, because it is difficult to control a degree of over-etching during the etching process, the substrate may be excessively etched to potentially cause cracks in the semiconductor device region and the seal-ring region. The stress in the test pad region, which is disposed next to the etched interlayer dielectric layer, may be weakened such that the test pad region moves, causing difficulty in aligning the test pad on the correct position during the blade dicing process. If it is not aligned, the device may be destroyed or cracked when the blade dicing process is performed in the semiconductor device region and the seal-ring region. Therefore, in another example of FIG. 6A, a thin dielectric layer 22 of about 0.2 μm to 3 μm may be left in the lower region of the interlayer dielectric layer in order to minimize device destruction and cracks.

In the etching process of FIG. 4C, the metal pads 50 and 60 and the test pad 70 are completely surrounded and protected by the passivation dielectric layer 80.

As illustrated in FIG. 4C, the reason why only the interlayer dielectric layer regions on both sides of the test pad 70 are patterned and etched while the test pad 70 remains is to test a performance of the semiconductor device using the test pad 70 in the final manufacturing process.

The first mask patterns 85a to c are removed after etching the interlayer dielectric layer regions on both sides of the test pad 70.

Figure 4D:
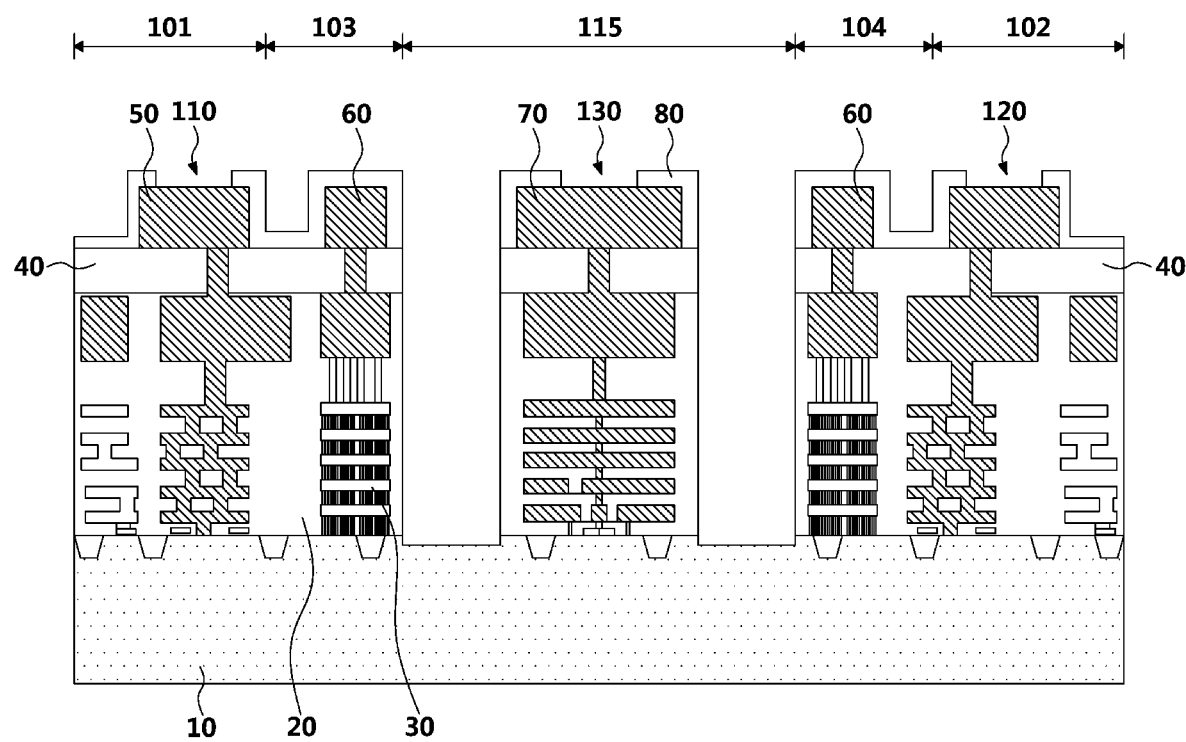

Next, as illustrated in FIG. 4D, after the etching process for interlayer dielectric layers on both sides of the test pad 70 is completed, a second mask pattern (not illustrated) may be formed on the metal pad 50 and the test pad 70. The second mask pattern (not illustrated) may be formed in order to etch the passivation region formed on the metal pad 50 and the test pad 70. The passivation dielectric layer may be etched to expose portions 110, 120, and 130 of the metal pads and the test pad 70. That is, a first etching until the silicon substrate 10 is exposed, and a second etching of exposing a portion of the pads 50 and 70 are included. In this state, the performance of the semiconductor device can be tested using the test pad 70.

After a portion of the pads 50 and 70 are etched and exposed, the second mask pattern may be removed.

Figure 4E:
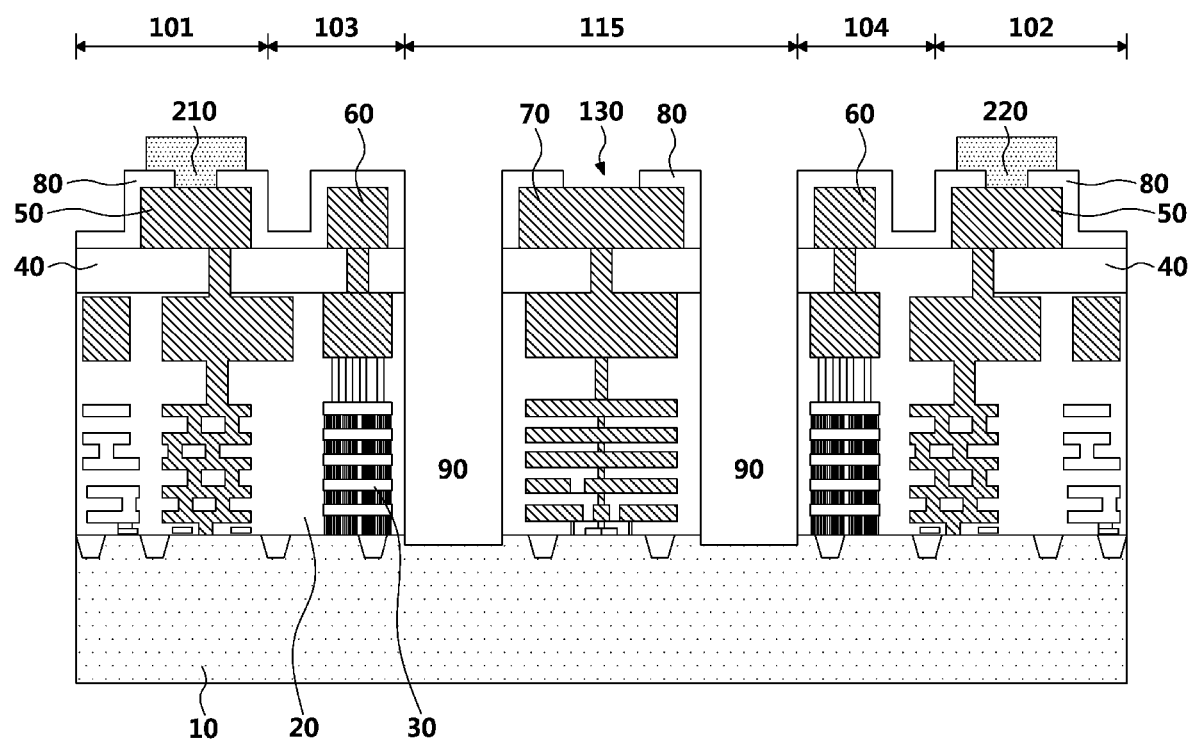

FIG. 4E illustrates forming of the metal bumps 210 and 220 using the exposed portions of the pads 50 and 70 after the etching process of the second step is completed. As illustrated, the metal bumps 210 and 220 are formed on the semiconductor device, and the metal bumps 210 and 220 are formed by being directly connected to the metal pad 50. As described above, it may be possible to be directly connected because a portion of the passivation dielectric layer 80 formed on the metal pad 50 is removed and the pad 50 is exposed. A metal bump is not formed because the test pad 70 is removed by a dicing process.

When the metal bumps 210 and 220 are formed, a self-align process may be performed to form the metal bumps 210 and 220 without an additional mask.

In the present disclosure, semiconductor die regions 101 and 102 are formed in a wafer using the semiconductor device manufactured as described above.

Next, a process of forming an individual semiconductor die is performed. The individual semiconductor die may be formed by removing a silicon substrate by a blade dicing process. That is, in an alternative art, there is a laser grooving process to form a grooving using a laser light source to isolate a semiconductor die. But in the present disclosure, such a laser grooving process may be omitted. Therefore, there is an effect of preventing generating of burrs or silicon debris combined with metal components, such as copper or aluminum, and silicon elements.

Figure 5A:
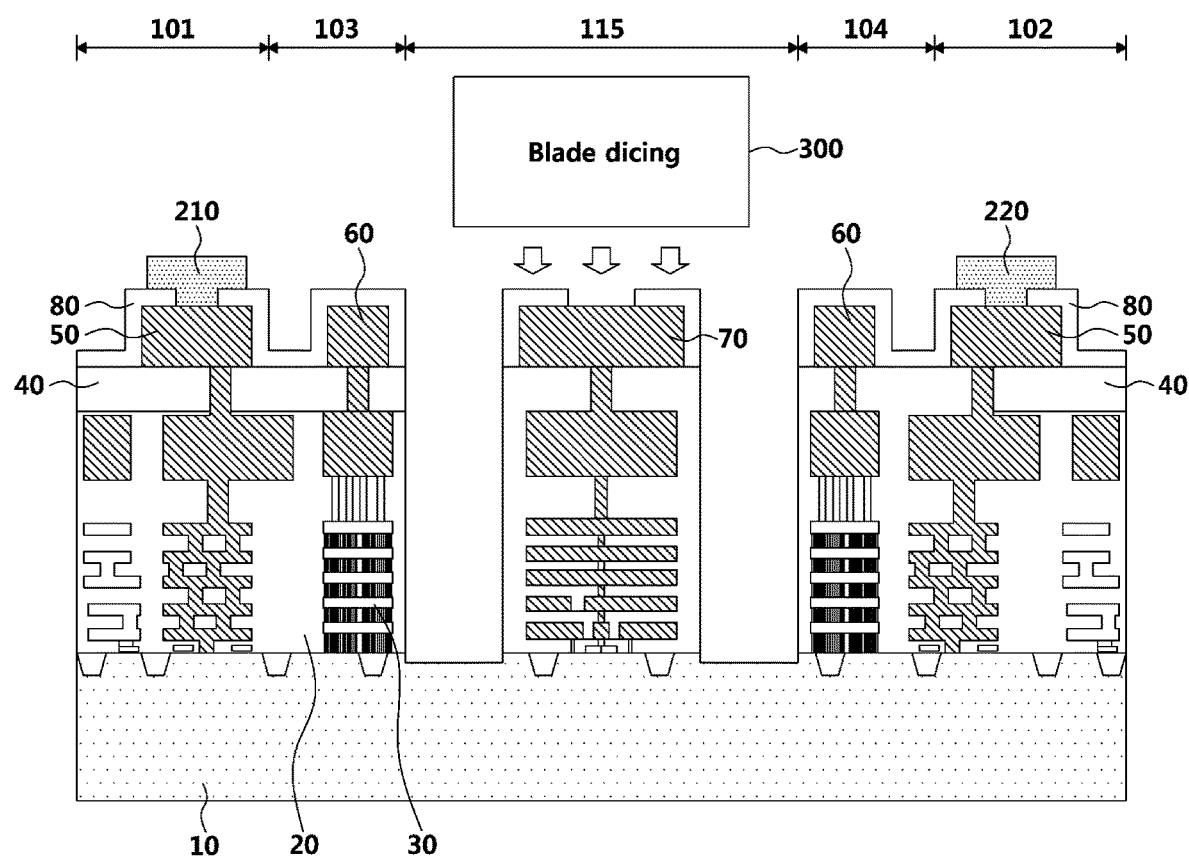
FIGS. 5A and 5B illustrate an example of a method for forming a semiconductor die.
Figure 5B:
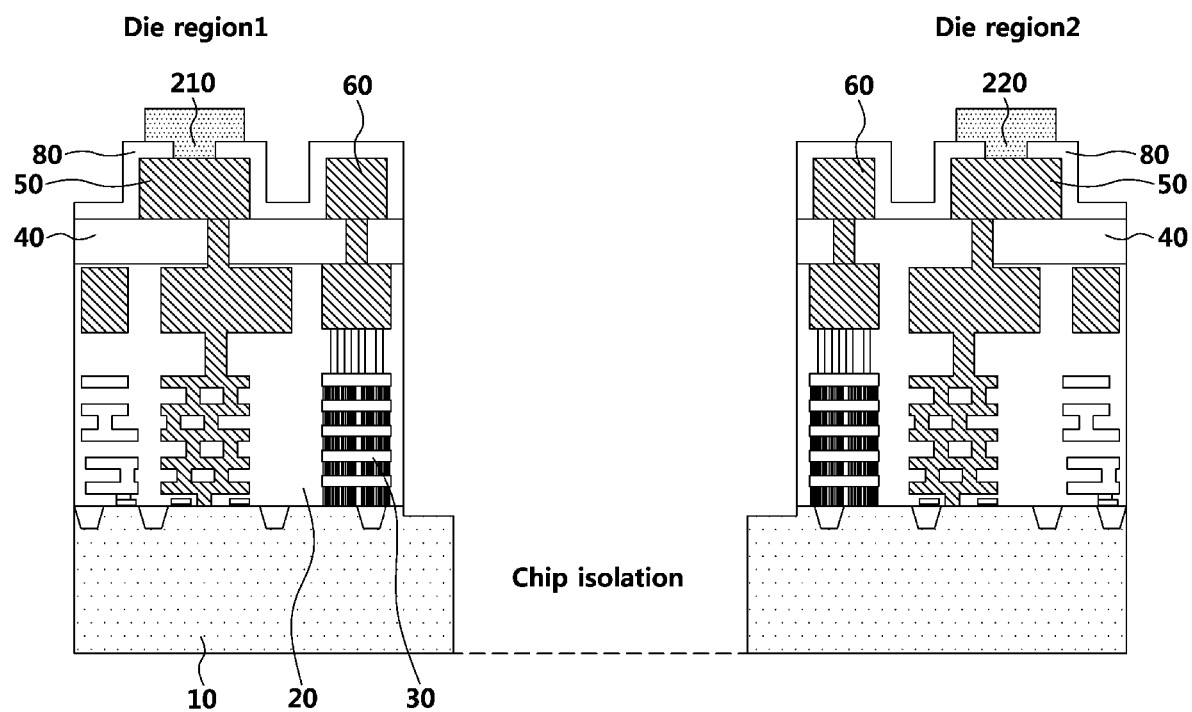

FIGS. 5A and 5B are cross-sectional views of an example of a semiconductor device showing a blade dicing process and an example after performing the blade dicing process, respectively.

A test process may be performed for testing whether the metal bumps 210 and 220 are well connected to the metal pads 50, respectively, using the metal bumps 210 and 220 formed in the semiconductor die regions 101 and 102 even after the metal bumps 210 and 220 are formed. When the specified specifications for the semiconductor device are satisfied, a process for forming an individual semiconductor die is performed.

As illustrated in FIG. 5A, a sawing process is performed using a blade 300 of a predetermined size to remove up to a silicon substrate. That is, a mechanical sawing is performed in a state of which peripheries of both sides of the test pad 70 are etched by the first etching to the point that the silicon substrate 10 is exposed. At the time of the sawing process, the passivation dielectric layer 80 and the interlayer dielectric layers 20 and 40, existing between the seal-ring region 103 and the test region 115, are removed in advance. Thus, while mechanical sawing is in progress, damage does not occur to the interlayer dielectric layers 20 and 40 existing in the die regions 101 and 102. Therefore, the strength of the interlayer dielectric layers 20 and 40 existing in the die region may be maintained as it is.

FIG. 5B is a cross-sectional view of an individual semiconductor die after a mechanical sawing. A silicon substrate 10 is removed by the mechanical sawing, and the semiconductor device is isolated to provide an individual semiconductor die.

Figure 6A:
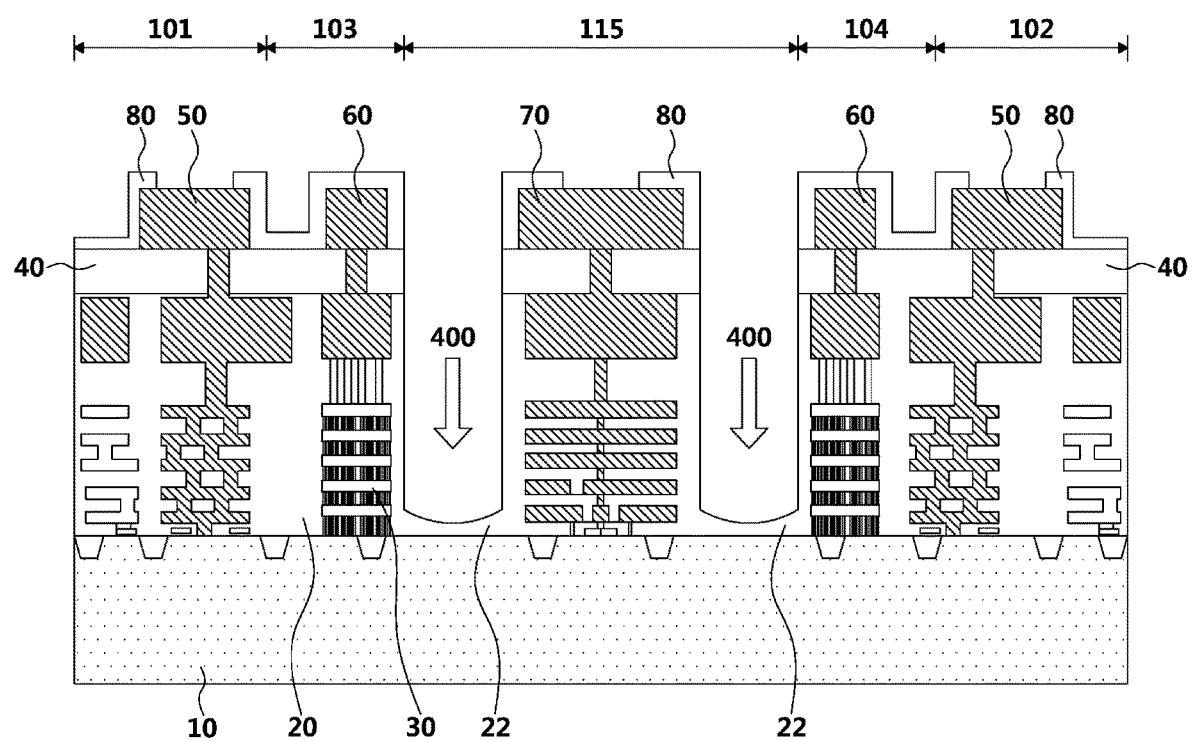
FIGS. 6A and 6B illustrate another example of a method for forming a semiconductor die.
Figure 6B:
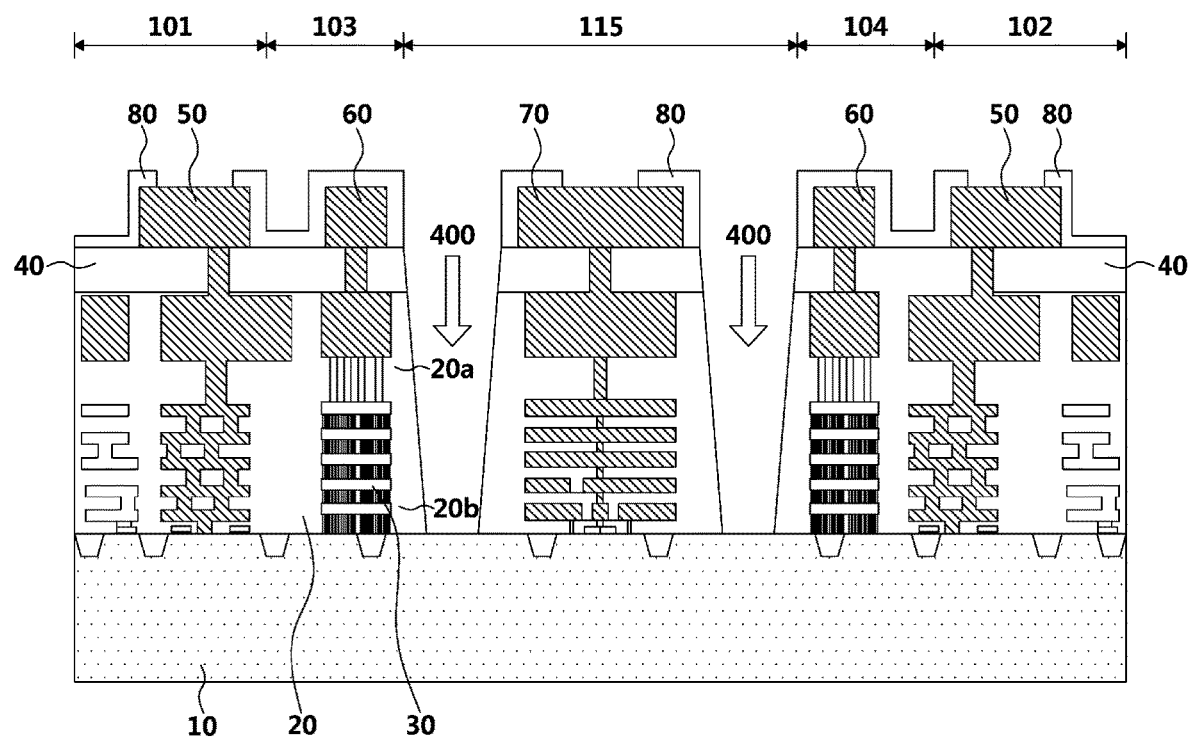
Figure 7:
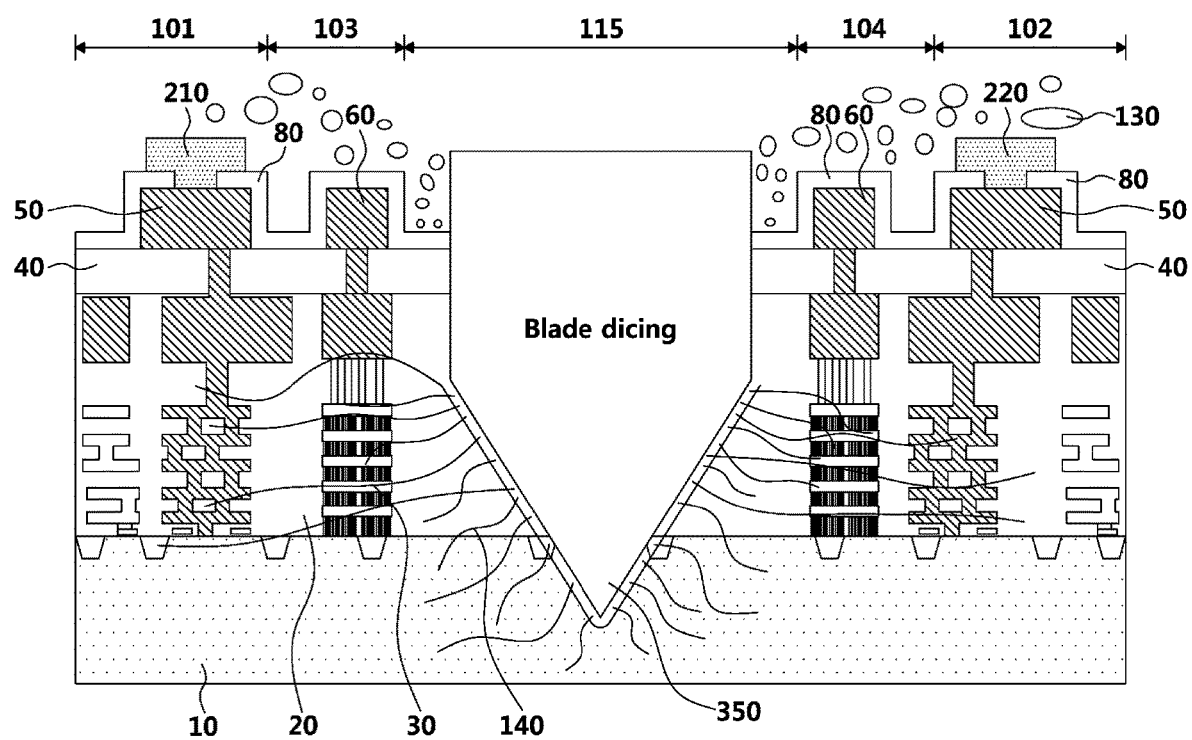
FIG. 7 is a typical process of dicing a device through a blade dicing process.

FIGS. 6A and 6B are cross-sectional views of another example of a semiconductor device during a first step etching process. In the example of the present disclosure, when an etching process is performed on a portion of the interlayer dielectric layer of the test pad 70 in the scribe line region, the process of leaving a part of the lower region of the interlayer dielectric layer and an example of the trench which may be formed in a tapered shape that has a width gradually decreasing from the upper surface to the end of the lower surface with respect to the sidewall of the interlayer dielectric layer, are formed.

FIG. 6A is a cross-sectional view of a semiconductor device in which a portion of the lower region 22 of the interlayer dielectric layer remains, as described above.

FIG. 6B illustrates that the interlayer dielectric layers 20 and 40 are etched in a shape of a reverse trapezoid while etching the silicon substrate 10 to be exposed. Alternatively, depending on the condition of the etching process, the width narrows toward the lower part of the dielectric layer so that the sidewalls of the dielectric layer are etched in a tapered shape. That is, there is an effect of protecting a semiconductor device structure, such as a transistor and a metal, located in the lower region 20b of the dielectric layer when the dielectric layer is etched in a tapered shape that becomes thinner toward the lower part.

As illustrated in FIGS. 6A and 6B, because a semiconductor device in which interlayer dielectric layer regions on both sides of the test pad 70 are etched in the scribe line region used, an individual semiconductor die may be manufactured in the blade dicing process.

According to the method for forming a semiconductor die of the present disclosure, by plasma etching the interlayer dielectric layer formed on both sides of the test pad in the scribe line region before performing the blade dicing process, there is an effect of preventing problems such as a silicon debris or burr, silicon damage or crack or the like compare to a method of dicing the semiconductor die only by blade dicing.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for forming a semiconductor die, the method comprising:
    forming an interlayer dielectric layer on a substrate having a semiconductor die region, a seal-ring region, and a scribe line region;
    forming a metal pad and a test pad on the interlayer dielectric layer;
    forming a passivation dielectric layer on the interlayer dielectric layer, the metal pad, and the test pad;
    first etching the passivation dielectric layer and the interlayer dielectric layer existing between the seal-ring region and the scribe line region to a predetermined depth using a plasma etching process;
    second etching the passivation dielectric layer to expose the metal pad and the test pad;
    forming a bump on the metal pad; and
    dicing the substrate while removing the scribe line region by mechanical sawing.

2. The method of claim 1, wherein the first etching exposes a surface of the substrate.

3. The method of claim 1, wherein the first etching partially etches the interlayer dielectric layer to not expose a surface of the substrate.

4. The method of claim 3, wherein a remaining interlayer dielectric layer has a thickness of 0.2 to 3 µm.

5. The method of claim 1, wherein the first etching defines a conic contour in the interlayer dielectric layer.

6. The method of claim 1, wherein the first etching etches a portion of the substrate by over-etching a surface of the substrate.

7. The method of claim 1, wherein the interlayer dielectric layer is formed of a low-k dielectric layer.

8. A method for forming a semiconductor die, the method comprising:
 forming a first interlayer dielectric layer on a substrate having a die region and a scribe line region;
 forming a second interlayer dielectric layer on the first interlayer dielectric layer;
 forming a metal pad in the die region and a test pad in the scribe line region, respectively, on the second interlayer dielectric layer;
 forming a passivation dielectric layer on the second interlayer dielectric layer, the metal pad, and the test pad;
 performing a first etching process on the passivation dielectric layer and the first and second interlayer dielectric layers formed on both sides of the test pad using a plasma etching process to expose a surface of the substrate;
 performing a second etching process on the passivation dielectric layer formed on the metal pad and the test pad to expose the metal pad and the test pad;
 forming a bump on the metal pad; and
 dicing the substrate while removing the scribe line region using a blade dicing process.

9. The method of claim 8, wherein the plasma etching process uses a combination of $CF_4/O_2/N_2$ gases.

10. The method of claim 8, further comprising testing, after performing the second etching process on the passivation dielectric layer, a performance of the semiconductor device using the test pad.

11. The method of claim 8, further comprising testing, after forming the bump on the metal pad, a connection state of the bump and the metal pad using the bump.

12. The method of claim 8, wherein the passivation dielectric layer includes a silicon nitride layer and an oxide layer.

13. A method of forming a semiconductor device, the method comprising:
 forming an interlayer dielectric layer on a substrate having a semiconductor die region and a scribe line region;
 forming a metal pad in the semiconductor die region and a test pad in the scribe line region, respectively, on the interlayer dielectric layer;
 forming a passivation dielectric layer on the interlayer dielectric layer, the metal pad, and the test pad; and
 performing a first etching process on the passivation dielectric layer and the interlayer dielectric layer formed on both sides of the test pad to a predetermined depth using a plasma etching process;
 performing a second etching process on the passivation dielectric layer formed on the metal pad and the test pad to expose the metal pad and the test pad;
 forming a bump on the metal pad; and
 dicing the substrate to remove the scribe line region by mechanical sawing.

14. The method of claim 13, wherein the first etching process is performed to expose a surface of the substrate.

15. The method of claim 13, wherein the first etching process is performed to partially etch the interlayer dielectric layer to not expose a surface of the substrate.

16. The method of claim 13, wherein the interlayer dielectric layer comprises:
 a first interlayer dielectric layer formed on the substrate;
 a second interlayer dielectric layer formed on the first interlayer dielectric layer; and
 a metal wire formed on the first interlayer dielectric layer.

17. The method of claim 16, wherein the first interlayer dielectric layer is a low-k dielectric layer.

18. The method of claim 16, wherein the first interlayer dielectric layer and the second interlayer dielectric layer are the same dielectric layer.

19. The method of claim 16, wherein the second interlayer dielectric layer has a higher dielectric constant value than the first interlayer dielectric layer.

* * * * *